(12) United States Patent
Lee et al.

(10) Patent No.: US 9,425,430 B2
(45) Date of Patent: Aug. 23, 2016

(54) METHOD OF FABRICATING LIGHT EXTRACTION SUBSTRATE FOR OLED

(71) Applicant: Samsung Corning Precision Materials Co., Ltd., Gyeongsanbuk-do (KR)

(72) Inventors: Kiyeon Lee, ChungCheongNam-Do (KR); Kyungmin Yoon, ChungCheongNam-Do (KR); Youngseok Lee, ChungCheongNam-Do (KR); Jaeho Lee, ChungCheongNam-Do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/272,883

(22) Filed: May 8, 2014

(65) Prior Publication Data

US 2014/0335637 A1    Nov. 13, 2014

(30) Foreign Application Priority Data

May 8, 2013   (KR) .................. 10-2013-0051995

(51) Int. Cl.
*H01L 51/52*   (2006.01)
*G02B 5/02*   (2006.01)
*C03C 8/16*   (2006.01)
*C03C 17/04*   (2006.01)
*C03C 17/34*   (2006.01)

(52) U.S. Cl.
CPC ............. *H01L 51/5275* (2013.01); *C03C 8/16* (2013.01); *C03C 17/04* (2013.01); *C03C 17/3411* (2013.01); *G02B 5/0247* (2013.01); *C03C 2217/425* (2013.01)

(58) Field of Classification Search
CPC ..................... H01L 51/5275; G02B 5/0247
USPC ............................................... 438/29
See application file for complete search history.

(56) References Cited

U.S. PATENT DOCUMENTS

| | | | | |
|---|---|---|---|---|
| 4,336,338 A | * | 6/1982 | Downs et al. ................. | 428/402 |
| 2004/0253427 A1 | * | 12/2004 | Yokogawa ........... | C09D 7/1291 428/212 |
| 2009/0065049 A1 | * | 3/2009 | Son ..................... | H01L 51/5237 136/256 |
| 2009/0153972 A1 | * | 6/2009 | Nakamura .......... | H01L 51/5268 359/599 |
| 2012/0091447 A1 | * | 4/2012 | Yamamoto .............. | F21V 5/007 257/40 |
| 2013/0187141 A1 | * | 7/2013 | Nakamura .......... | H01L 51/5268 257/40 |

FOREIGN PATENT DOCUMENTS

DE          EP 2592056 A1 *   5/2013   .............. C03C 1/008

* cited by examiner

*Primary Examiner* — Mohammad Islam
*Assistant Examiner* — Christina Sylvia
(74) *Attorney, Agent, or Firm* — Lerner, David, Littenberg, Krumholz & Mentlik, LLP

(57) ABSTRACT

An organic light-emitting device (OLED) which can improve the light extraction efficiency of the OLED, a method of fabricating the same and an OLED including the same. The light extraction substrate is disposed on one surface of an OLED through which light generated from the OLED is emitted outward, and includes a base substrate and a light extraction layer formed on the base substrate. The light extraction layer has therein a plurality of pores which is formed on the base substrate such that the base substrate forms a bottom surface of the plurality of pores.

8 Claims, 2 Drawing Sheets

METHOD OF FABRICATING LIGHT EXTRACTION SUBSTRATE FOR OLED

CROSS REFERENCE TO RELATED APPLICATION

The present application claims priority from Korean Patent Application Number 10-2013-0051995 filed on May 8, 2013, the entire contents of which are incorporated herein for all purposes by this reference.

BACKGROUND OF THE INVENTION

1. Field of the Invention

The present invention relates to a light extraction substrate for an organic light-emitting device (OLED), a method of fabricating the same and an OLED including the same, and more particularly, to a light extraction substrate for an OLED which can improve the light extraction efficiency of the OLED, a method of fabricating the same and an OLED including the same.

2. Description of Related Art

In general, light emitting devices can be generally divided into organic light-emitting devices (OLEDs) in which a light-emitting layer is made of an organic matter and inorganic light-emitting devices (ILEDs) in which a light-emitting layer is made of an inorganic matter. Among them, OLEDs are self-emitting devices which generate light as excitons that are generated through the recombination of electrons injected through a cathode and holes injected through an anode emit energy. OLEDs have a variety of advantages, such as, self-emission, a wide viewing angle, a high resolution, natural color reproduction and rapid response.

Recently, active studies are underway in order to apply OLEDs to a variety of devices, such as portable information devices, cameras, watches, office equipment, information display windows of vehicles, televisions (TVs), displays, or illumination systems.

Methods for improving the luminous efficiency of OLEDs include a method of improving the luminous efficiency of a material that constitutes a light-emitting layer and a method of improving the light extraction efficiency at which light generated from the light-emitting layer is extracted.

The light extraction efficiency depends on the refractive indices of layers which form each OLED. In a typical OLED, when a ray of light generated from the light-emitting layer is emitted at an angle greater than a critical angle, the ray of light is totally reflected at the interface between a higher-refractivity layer, such as a transparent electrode layer, and a lower-refractivity layer, such as a substrate. This consequently lowers the light extraction efficiency, thereby lowering the luminous efficiency, which is problematic.

In fact, due to this problem of total reflection at the interface, only about 25% of light generated from the light-emitting layer of an OLED is emitted outward and about 75% of the light is lost.

The information disclosed in the Background of the Invention section is provided only for enhancement of (or better) understanding of the background of the invention, and should not be taken as an acknowledgment or any form of suggestion that this information forms a prior art that would already be known to a person skilled in the art.

RELATED ART DOCUMENT

Patent Document 1: United States Patent Application Publication No. 2011/0120555 (May 26, 2011)

BRIEF SUMMARY OF THE INVENTION

Various aspects of the present invention provide a light extraction substrate for an organic light-emitting device (OLED) which can improve the light extraction efficiency of the OLED, a method of fabricating the same and an OLED including the same.

In an aspect of the present invention, provided is a light extraction substrate which is disposed on one surface of an OLED through which light generated from the OLED is emitted outward. The light extraction substrate includes a base substrate and a light extraction layer formed on the base substrate. The light extraction layer has therein a plurality of pores which is formed on the base substrate such that the base substrate forms a bottom surface of the plurality of pores.

According to an embodiment of the present invention, the light extraction layer may include a plurality of hemispherical beads formed on the base substrate.

The plurality of beads may be formed continuously or discontinuously on the base substrate.

The plurality of pores may be respectively formed in the plurality of beads.

The light extraction layer may be made of a glass frit.

The light extraction substrate may further include a planarization layer formed on the light extraction layer.

In another aspect of the present invention, provided is a method of fabricating a light extraction substrate which is disposed on one surface of an OLED through which light generated from the OLED is emitted outward. The method includes the following steps of: forming a frit powder by melting and pulverizing a glass; forming a frit paste by mixing the formed frit powder into an organic solvent to which an organic binder is added; applying the formed frit paste on a base substrate by screen printing; and firing the printed frit paste to form a light extraction layer in which a plurality of pores having the base substrate as a bottom surface is formed.

According to an embodiment of the present invention, the step of forming the frit powder may include melting and pulverizing the glass having a softening point ranging from 350 to 600° C.

The step of forming the frit powder may include controlling the process of pulverizing the glass such that a maximum particle size of the glass is 15 μm or less.

The step of forming the frit paste may include controlling a content of the frit powder to be in a range from 50 to 80% of the organic solvent.

The step of forming the frit paste may include controlling a viscosity of the frit paste to be in a range from 30,000 to 150,000 cps.

The method may further include the step of forming a planarization layer on the light extraction layer.

In a further aspect of the present invention, provided is an OLED that includes the above-mentioned light extraction substrate as a substrate which is disposed on one surface of the OLED through which light generated from the OLED is emitted.

According to embodiments of the present invention, the light extraction layer that has pores therein and is made a glass frit is formed on one surface of the base substrate, such that light generated from the OLED can be scattered by the pores while passing through the light extraction layer. This can consequently improve the light extraction efficiency of the OLED, allow the OLED to operate at a low current, reduce the power consumption of the OLED, and improve the luminance of the OLED.

In addition, since the surface of the light extraction layer is formed flat, the light extraction layer can be applied as an internal light extraction layer of the OLED.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
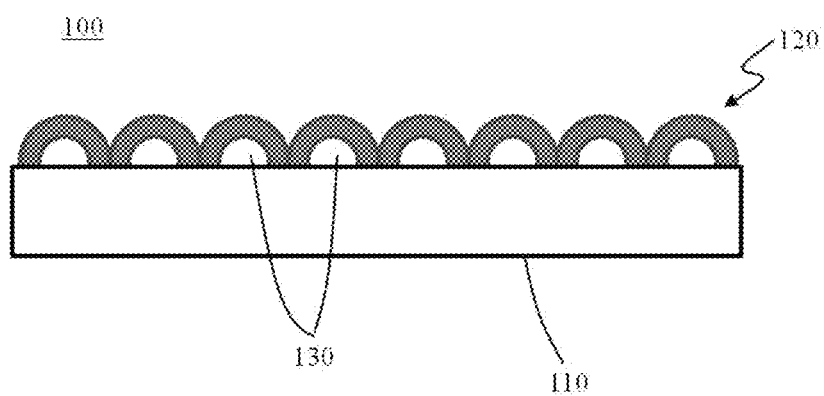
FIG. 1 is a cross-sectional view schematically showing a light extraction substrate for an organic light-emitting device (OLED) according to an exemplary embodiment of the present invention.

Reference will now be made in detail to a light extraction substrate for an organic light-emitting device (OLED), a method of fabricating the same and an OLED including the same according to the present invention, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1, a light extraction substrate 100 for an organic light-emitting device (OLED) according to an exemplary embodiment of the present invention is a functional substrate which improves the light extraction efficiency of the OLED in order to increase the luminance of a display or an illumination system that employs the OLED. For this, the light extraction substrate 100 for an OLED according to this exemplary embodiment is disposed on one surface of the OLED through which light generated from the OLED is emitted outward.

The light extraction substrate 100 for an OLED includes a base substrate 110 and a light extraction layer 120.

The base substrate 110 is the substrate which supports the light extraction layer 120 which is formed on one surface of the base substrate 110. The base substrate 110 is also disposed in front of the OLED, i.e. in the direction in which light generated from the OLED is emitted outward, and allows the generated light to exit through it. The base substrate 110 also serves as an encapsulation substrate which protects the OLED from the external environment.

The base substrate 110 can be implemented as any transparent substrate that has superior light transmittance and superior mechanical properties. For instance, the base substrate 110 can be made of a polymeric material, such as a thermally or ultraviolet (UV) curable organic film, or a chemically strengthened glass, such as soda-lime glass ($SiO_2$—$CaO$—$Na_2O$) or aluminosilicate glass ($SiO_2$—$Al_2O_3$—$Na_2O$).

When the OLED that employs the light extraction substrate 100 according to this exemplary embodiment is used in an illumination system, the base substrate 110 can be made of soda-lime glass. When the OLED is used in a display, the base substrate 110 can be made of aluminosilicate glass. The base substrate 110 can also be implemented as a substrate made of a metal oxide or a metal nitride. According to an embodiment of the present invention, the base substrate 110 can also be made of a thin glass having a thickness of 1.5 mm or less. The thin glass can be made using a fusion process or a floating process.

The light extraction layer 120 is formed on the base substrate 110. According to an embodiment of the present invention, the light extraction layer 120 may be disposed on the other surface of the base substrate 110, in which the OLED is disposed on one surface of the base substrate 110. In this case, the light extraction layer 120 serves as an external light extraction layer of the OLED.

As shown in the figures, according to this exemplary embodiment, a plurality of pores 130 is formed on top of the base substrate 110 such that the base substrate 110 forms a bottom surface of the plurality of pores 130. The plurality of pores 130 is formed in an inward direction of the light extraction layer 120 from the boundary between the light extraction layer 120 and the base substrate 110. A plurality of pores 130 serves to diversify or increase paths along which light generated from the OLED scatters, thereby improving the light extraction efficiency of the OLED. since the light extraction efficiency of the OLED is improved by the plurality of pores 130, it is possible to operate the OLED at a low current, reduce the power consumption of the OLED, and thus increase the luminance of a display or an illumination system that employs the OLED.

Figure 2:
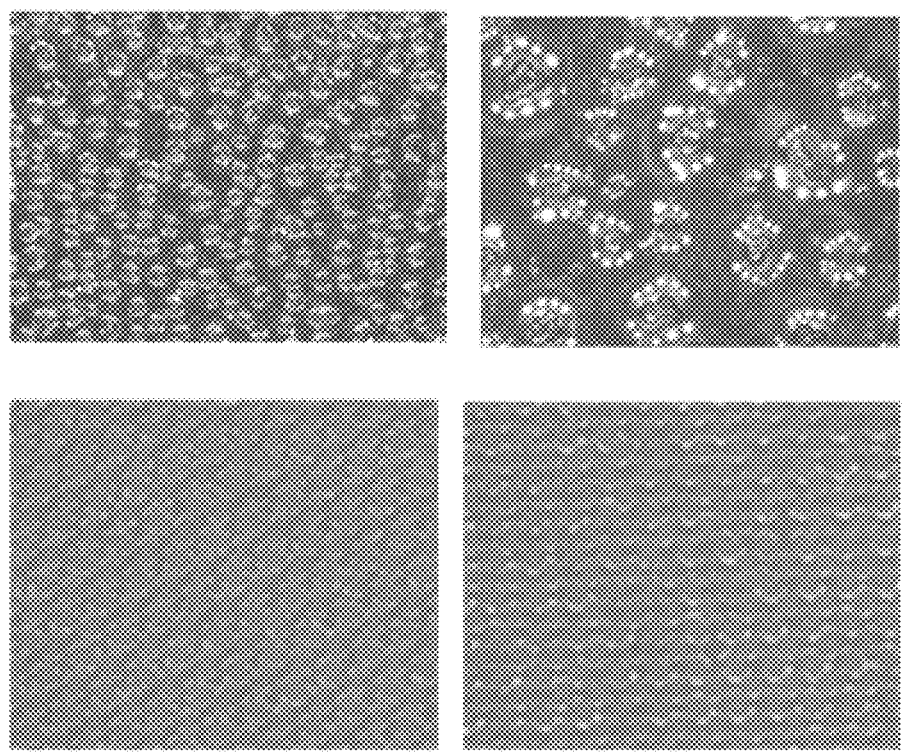
FIG. 2 is scanning electron microscopy (SEM) pictures taken from the surface of the light extraction substrate for an OLED according to an exemplary embodiment of the present invention.

According to an embodiment of the present invention, the light extraction layer 120 can be implemented as a plurality of hemispherical beads which is disposed on the base substrate 110. As shown in FIG. 1 and FIG. 2, the plurality of beads which forms the light extraction layer 120 in this manner can be formed continuously or discontinuously. The plurality of pores 130 which serves to scatter light can be respectively formed in the plurality of bead.

The light extraction layer 120 composed of a plurality of beads in which the pores 130 are formed can be formed on the base substrate 110 by applying a frit paste by screen printing and curing which will be described in more detail later in relation to the method of fabricating a light extraction substrate for an OLED.

Although not shown in the figures, the OLED which includes the light extraction substrate 100 including the base substrate 110, the light extraction layer 120 and the pores 130 as an external light extraction substrate can have a stacked structure in which an anode, an organic light-emitting layer and a cathode are sandwiched between the light extraction substrate 100 according to this exemplary embodiment and another substrate which faces the light extraction substrate 100. The anode can be made of a metal or an oxide, such as gold (Au), indium (In), tin (Sn) or indium tin oxide (ITO), which has a significant work function in order to facilitate the hole injection. The cathode can be made of a metal, such as Al, Al:Li or Mg:Ag, having a smaller work function in order to facilitate the electron injection. In a top emission type OLED, the cathode can have a multilayer structure that includes a semitransparent electrode of a metal thin film made of Al, Al:Li or Mg:Ag and a transparent electrode of an oxide thin film made of indium tin oxide (ITO) in order to facilitate the transmission of light generated from the organic light-emitting layer. The organic light-emitting layer includes a hole injection layer, a hole transport layer, a light-emitting layer, an electron transport layer and an electron injection layer which are sequentially stacked on the anode.

When a forward voltage is applied between the anode and the cathode of this structure, electrons from the cathode migrate to the light-emitting layer through the electron injection layer and the electron transport layer, and holes from the anode migrate to the light-emitting layer through the hole injection layer and the hole transport layer. The electrons and holes that have migrated into the light-emitting layer recombine with each other, thereby generating excitons. When these excitons transit from an excited state to a ground state, light is emitted. The brightness of the light emitted is proportional to the amount of current that flows between the anode and the cathode.

Reference will now be made to a light extraction substrate for an OLED according to another exemplary embodiment of the present invention in conjunction with FIG. 3.

Figure 3:
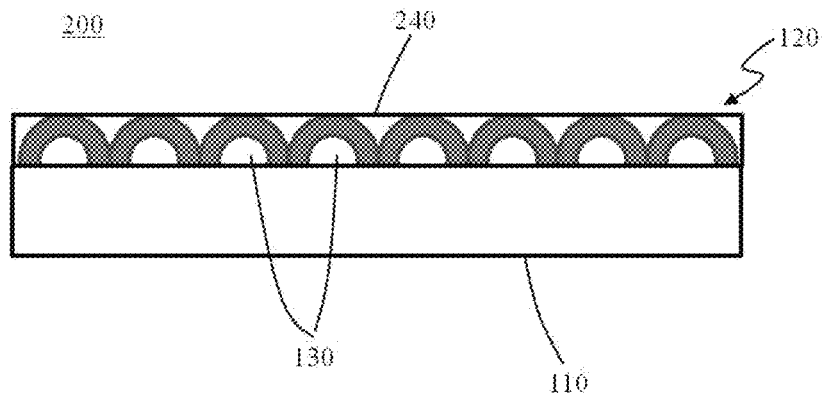
FIG. 3 is a cross-sectional view schematically showing a light extraction substrate for an OLED according to another exemplary embodiment of the present invention.

FIG. 3 is a cross-sectional view schematically showing the light extraction substrate for an OLED according to another exemplary embodiment of the present invention.

As shown in FIG. 3, the light extraction substrate 200 for an OLED according to this exemplary embodiment includes a base substrate 110, a light extraction layer 120, a plurality of pores 130 and a planarization layer 240.

This exemplary embodiment of the present invention is substantially the same as the former exemplary embodiment of the present invention except that the planarization layer is included. Therefore, the same reference numerals will be used to designate the same elements, and detailed descriptions thereof will be omitted.

The planarization layer 240 according to this exemplary embodiment is formed on the light extraction layer 120 in order to planarize the surface of the light extraction layer 120 consisting of a plurality of hemispherical beads. The planarization layer 240 can be made of a glass frit, the refractive index of which is the same as or different from that of the light extraction layer 120. For instance, the planarization layer 240 can be made of a glass frit having a high refractive index of 1.65 or higher.

The light extraction substrate 200, the surface of which is planarized by the planarization layer 240, can be applied as an internal light extraction substrate of the OLED. The planarization layer 240 adjoins to an anode of the OLED.

Reference will now be made to a method of fabricating a light extraction substrate for an OLED according to an exemplary embodiment of the present invention in conjunction with FIG. 4. As for the reference numerals of individual elements, those in FIG. 1 and FIG. 3 will be referred to.

Figure 4:
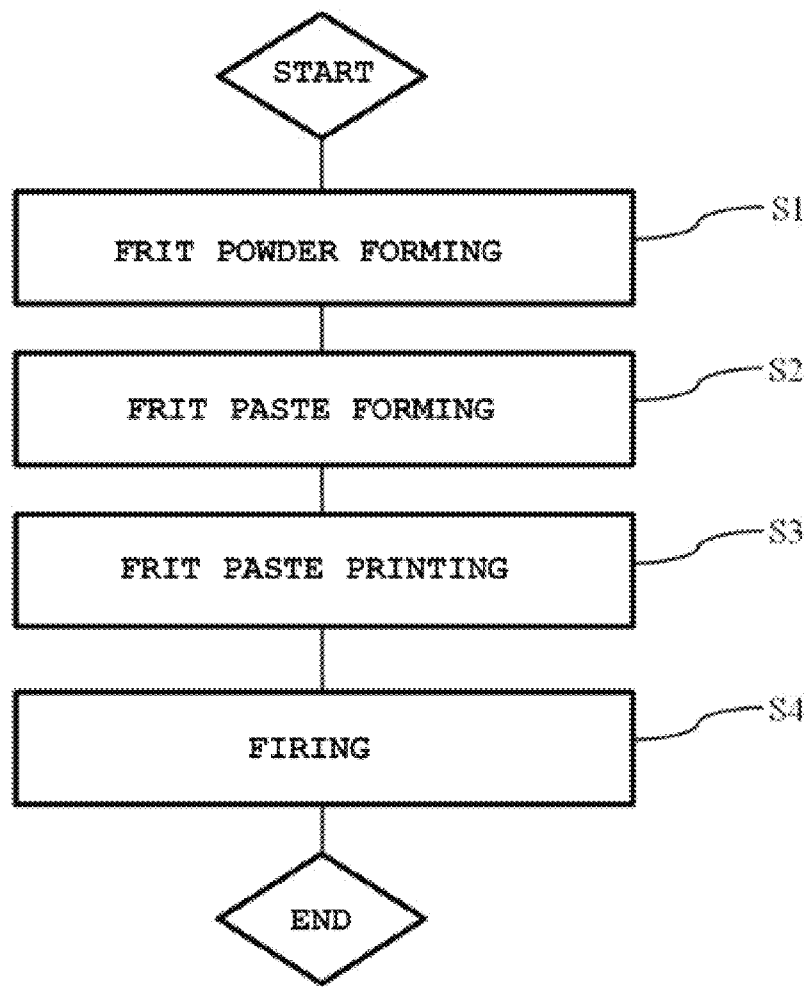
FIG. 4 is a process flowchart showing a method of fabricating a light extraction substrate for an OLED according to an exemplary embodiment of the present invention.

As shown in FIG. 4, the method of fabricating a light extraction substrate for an OLED according to this exemplary embodiment is the method of fabricating the light extraction substrate 100 which is disposed on one surface of the OLED through which light generated from the OLED is emitted outward, and includes a frit powder forming step S1, a frit paste forming step S2, a frit paste printing step S3 and a firing step S4.

First, the frit powder forming step S1 is the step of making a frit powder by melting and grinding a glass. Specifically, the frit powder forming step S1 forms a frit powder by melting a glass having a softening point of 600° C. or below, preferably, a softening point ranging from 350 to 600° C., and then grinding the molten glass into a powder. If a glass having a softening point above 600° C. is used, the base substrate 110 may be deformed in the firing process which will proceed later.

At the frit powder forming step S1, it is preferred that the average particle size of the frit powder be set to a range from 1 to 3 µm. In particular, at the frit powder forming step S1, it is preferred that the maximum particle size of the frit powder be set to 15 µm or less. If the maximum particle size of the frit powder exceeds 15 µm, the pores 130 which scatter light may not be formed in the light extraction layer 120 in the firing process which will proceed later. When the pores 130 are not formed, an improvement in the light extraction efficiency of the OLED is not expectable.

The subsequent frit paste forming step S2 is the step of forming a frit paste by mixing the frit powder formed at the frit powder forming step S1 into an organic solvent to which an organic binder is added. At the frit paste forming step S2, the organic solvent can be implemented as at least one selected from among, but not limited to, butyl carbitol acetate (BCA), α-terpineol (α-TPN), dibutyl phthalate (DBP), ethyl acetate, β-terpineol, cyclohexanone, cyclopentanone, hexylene glycol, high boiling point alcohol and mixtures of alcohol ester.

In addition, at the frit paste forming step S2, the organic solvent can be implemented as at least one selected from among, but not limited to, ethyl cellulose, ethylene glycol, propylene glycol, ethyl hydroxyethyl cellulose, phenolic resin, mixtures of ethyl cellulose and phenolic resin, ester polymer, methacrylate polymer, methacrylate polymer of lower alcohol and monobutyl ether of ethylene glycol monoacetate.

It is preferred that the content of the frit powder with respect to the organic solvent be set within a range from 50 to 80% at the frit paste forming step S2. This can consequently control the viscosity of the frit paste to a range from 30,000 to 150,000 cps. At a viscosity of the frit paste below 30,000 cps, the pores 130 which scatter light may not be formed at the firing process which will proceed later. In addition, at a viscosity of the frit paste above 150,000 cps, it is difficult to perform the frit paste printing step S3 which will proceed later. Since the viscosity of the frit paste above 150,000 cps is too high, it is impossible to apply the frit paste on the base substrate 110 by screen printing.

Subsequently, the frit paste printing step S3 is the step of applying the frit paste, the viscosity of which is set at the frit paste forming step S2, on the base substrate 110 by screen printing. At the frit paste printing step S3, a screen mask to which the frit paste is supplied is placed in position above the base substrate 110, and then the frit paste is applied onto the base substrate 110 by a pressing method using a squeegee or the like. Due to the mesh structure of the screen mask and the viscosity of the frit paste, the frit paste forms a plurality of hemispherical bead structures when printed on the base substrate 110.

The final firing step S4 is the step of firing the frit paste printed on the base substrate 110. At the firing step S4, the frit paste can be fired, for example, at a temperature ranging from 530 to 550° C. for 20 minutes. Firing the frit paste in this manner produces the light extraction layer 120 on the base substrate 110 such that the light extraction layer 120 is composed of a plurality of beads in which the plurality of pores 130 having the base substrate 110 as their bottom surface is formed.

When the light extraction substrate 100 for an OLED fabricated in this manner is intended to be applied as an internal light extraction substrate of the OLED, the planarization layer 240 can be formed on the light extraction layer 120, for example, using a frit having a high refractive index of 1.65 or higher.

TABLE 1

|  | Ex. 1 | Ex. 2 | Ex. 3 | Ex. 4 | Comp. Ex. 1 | Comp. Ex. 2 |
|---|---|---|---|---|---|---|
| Viscosity of paste (cps) | 40,000 | 45,000 | 30,000 | 38,000 | 25,000 | 20,000 |
| Frit content (%) | 70 | 72 | 60 | 65 | 58 | 55 |
| Firing temperature (° C.) | 550 | 530 | 550 | 550 | 550 | 540 |
| Pores | ⊙ | ○ | ○ | ○ | Δ | X |

Table 1 above presents whether or not pores were formed depending on the viscosities of frit pastes, frit contents and firing temperatures. The results of Table 1 explain that the pores were not properly formed in Comparative Example 1 and Comparative Example 2 where the viscosities of frit pastes were relatively low and the frit contents were relatively low. In addition, referring to Example 1 to Example 4 in which the pores were formed, the optimum conditions for the formation of the pores were the paste viscosity of 40,000 cps, the frit content of 70% and the firing temperature of 550° C., as presented in Example 1.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A method of fabricating a light extraction substrate which is disposed on one surface of an organic light-emitting device through which light generated from the organic light-emitting device is emitted outward, the method comprising:
    forming a frit powder by melting and pulverizing a glass;
    forming a frit paste by mixing the formed frit powder into an organic solvent to which an organic binder is added;
    applying the formed frit paste on a base substrate by screen printing, thereby printing a plurality of bead structures on the base substrate; and
    firing the printed frit paste to form a light extraction layer in which a plurality of pores is formed, each pore having the base substrate as a bottom surface of the pore and extending into a respective bead of a plurality of beads, each bead formed from and corresponding to a respective bead structure of the printed bead structures.

2. The method according to claim 1, wherein forming the frit powder comprises melting and pulverizing the glass having a softening point ranging from 350 to 600° C.

3. The method according to claim 1, wherein forming the frit powder comprises controlling the process of pulverizing the glass such that a maximum particle size of the glass is 15 μm or less.

4. The method according to claim 1, wherein forming the frit paste comprises controlling a content of the frit powder to be in a range from 50 to 80% of the organic solvent.

5. The method according to claim 4, wherein forming the frit paste comprises controlling a viscosity of the frit paste to be in a range from 30,000 to 150,000 cps.

6. The method according to claim 1, further comprising forming a planarization layer on the light extraction layer.

7. The method according to claim 1, wherein applying the formed frit paste and firing the printed frit paste forms the beads in form of a plurality of hemispherical beads formed on the base substrate.

8. The method according to claim 7, wherein the plurality of beads is formed continuously or discontinuously on the base substrate.

* * * * *